US012755787B2

(12) United States Patent
Huang et al.

(10) Patent No.: US 12,755,787 B2
(45) Date of Patent: Oct. 6, 2026

(54) LOW-POWER PROGRAMMABLE ERASABLE NONVOLATILE MEMORY

(71) Applicant: YIELD MICROELECTRONICS CORP., Zhubei City (TW)

(72) Inventors: Yu-Ting Huang, Zhubei City (TW); Chi-Pei Wu, Zhubei City (TW); Ya-Ting Fan, Zhubei City (TW)

(73) Assignee: Yield Microelectronics Corp., Zhubei City (TW)

( * ) Notice: Subject to any disclaimer, the term of this patent is extended or adjusted under 35 U.S.C. 154(b) by 100 days.

(21) Appl. No.: 19/015,293

(22) Filed: Jan. 9, 2025

(65) Prior Publication Data

US 2026/0120769 A1 Apr. 30, 2026

(30) Foreign Application Priority Data

Oct. 29, 2024 (TW) ................................ 113141266

(51) Int. Cl.
*G11C 16/04* (2006.01)
*G11C 16/08* (2006.01)
*G11C 16/30* (2006.01)

(52) U.S. Cl.
CPC .......... *G11C 16/0491* (2013.01); *G11C 16/08* (2013.01); *G11C 16/30* (2013.01)

(58) Field of Classification Search
CPC ............................ G11C 16/0491; G11C 16/04
USPC .................................................... 365/185.16
See application file for complete search history.

(56) References Cited

U.S. PATENT DOCUMENTS 8,681,558 B2 * 3/2014 Nazarian .................. G11C 5/06
365/195
2005/0270850 A1 * 12/2005 Wang ................ G11C 16/3477
365/185.28

* cited by examiner

*Primary Examiner* — Muna A Techane
(74) *Attorney, Agent, or Firm* — Rosenberg, Klein & Lee

(57) ABSTRACT

A low-power programmable erasable nonvolatile memory includes common-source lines, word lines, bit lines, memory arrays, a first electronic switch, a second electronic switch, a decoding device, a first storage capacitor, a second storage capacitor, and a voltage boosting circuit. Each memory array is coupled to one common-source line, one word line, and four bit lines. The decoding device is coupled to the common-source lines, the word lines, the bit lines, a high voltage, a middle voltage, a low voltage, and a grounding voltage. One end of the storage capacitor is coupled to a reference voltage and another end of the storage capacitor is coupled to the decoding device through the electronic switch. The voltage boosting circuit, coupled to the first storage capacitor, charges the first storage capacitor to perform a programming activity or an erasing activity.

20 Claims, 3 Drawing Sheets

LOW-POWER PROGRAMMABLE ERASABLE NONVOLATILE MEMORY

BACKGROUND OF THE INVENTION

This application claims the priority of TW Patent Application No. 113141266, filed on 29 Oct. 2024, the content of which is incorporated by reference in its entirety.

FIELD OF THE INVENTION

The present invention relates to a low-power programmable erasable nonvolatile memory, particularly to a low-power programmable erasable nonvolatile memory that stores high-voltage charges with low power.

DESCRIPTION OF THE RELATED ART

The Complementary Metal Oxide Semiconductor (CMOS) technology has been developed as a commonly used process for fabricating Application Specific Integrated Circuits (ASIC). Nowadays, as the computer information products are blooming, flash memories and Electrically Erasable Programmable Read Only Memory (EEPROM) have been widely used in electronic products since the data stored within will not volatilize but can be erased and programmed electrically. In addition, the data will not disappear even after the power is turned off.

Non-volatile memories are programmable and are able to adjust gate voltages of their transistors by storing charges, or to preserve the original gate voltages of transistors by not storing charges. When regarding to erase a non-volatile memory, the charges stored in the non-volatile memory are removed to resume the initial state of the memory, and return to its original gate voltages of the transistors. In the existing technology, DC high-voltage charges are used to perform writing and erasing operations. However, DC high voltage will increase the power consumption of the circuit during the writing or erasing process. Especially when the circuit receives high voltage for a long time, the power consumption of the circuit will be higher. In addition, high-voltage charges may cause the materials of the storage medium to deteriorate or create a memory effect. These problems will reduce the stability of stored data and cause more errors for reading and writing data.

To overcome the abovementioned problems, the present invention provides a low-power programmable erasable nonvolatile memory, so as to solve the afore-mentioned problems of the prior art.

SUMMARY OF THE INVENTION

The present invention provides a low-power programmable erasable nonvolatile memory, which reduces power consumption and improves the stability of storing data.

In an embodiment of the present invention, a low-power programmable erasable nonvolatile memory is provided. The low-power programmable erasable nonvolatile memory includes a plurality of common-source lines arranged in parallel, a plurality of word lines arranged in parallel, a plurality of bit lines arranged in parallel, a plurality of memory arrays, a first electronic switch, a second electronic switch, a decoding device, at least one first storage capacitor, at least one second storage capacitor, and a voltage boosting circuit. The word lines are parallel to the common-source lines. The bit lines are perpendicular to the common-source lines. Each memory array is coupled to one common-source line, one word line, and four bit lines. The decoding device is coupled to the common-source lines, the word lines, the bit lines, a high voltage, a middle voltage, a low voltage, and a grounding voltage. The high voltage is greater than the middle voltage. The middle voltage is greater than the low voltage. The low voltage is greater than the grounding voltage. One end of the first storage capacitor is coupled to a reference voltage and another end of the first storage capacitor is coupled to the decoding device through the first electronic switch. One end of the second storage capacitor is coupled to a supply voltage and another end of the second storage capacitor is coupled to the decoding device through the second electronic switch. The voltage boosting circuit is coupled to the first storage capacitor. When the first electronic switch and the second electronic switch are turned off, the voltage boosting circuit receives an input voltage to charge the first storage capacitor to have a charging voltage greater than the reference voltage. When the first electronic switch and the second electronic switch are turned on, the decoding device biases one of the memory arrays as a target memory array based on voltages coupled to the decoding device. The first storage capacitor charges the second storage capacitor through the target memory array to perform a programming activity or an erasing activity.

In an embodiment of the present invention, the decoding device includes a first decoder, a second decoder, and a third decoder. The first decoder is coupled to the common-source lines, the second electronic switch, the middle voltage, the low voltage, and the grounding voltage. The second decoder is coupled to the word lines, the first electronic switch, the high voltage, the low voltage, and the grounding voltage. The third decoder is coupled to the bit lines, the first electronic switch, and the high voltage. The first decoder, the second decoder, and the third decoder are configured to bias the target memory array based on the voltages coupled to the first decoder, the second decoder and the third decoder.

In an embodiment of the present invention, the common-source lines include a first common source line, the word lines include a first word line, and the bit lines include a first bit line, a second bit line, a third bit line, and a fourth bit line. Each of the memory arrays includes a first memory cell, a second memory cell, a third memory cell, and a fourth memory cell. The control terminal of the first memory cell is coupled to the first word line and the data terminal of the first memory cell is coupled to the first common-source line and the first bit line. The control terminal of the second memory cell is coupled to the first word line and the data terminal of the second memory cell is coupled to the first common-source line and the second bit line. The control terminal of the third memory cell is coupled to the first word line and the data terminal of the third memory cell is coupled to the first common-source line and the third bit line. The control terminal of the fourth memory cell is coupled to the first word line and the data terminal of the fourth memory cell is coupled to the first common-source line and the fourth bit line. The first memory cell and the second memory cell are arranged symmetrically about the first common-source line. The third memory cell and the fourth memory cell are arranged symmetrically about the first common-source line. The first memory cell and the fourth memory cell are located between the first word line and the first common-source line.

In an embodiment of the present invention, the first memory cell includes a first N-type metal-oxide-semiconductor field-effect transistor (MOSFET) and a first capacitor. The drain of the first N-type MOSFET is coupled to the first bit line and the source of the first N-type MOSFET is coupled to the first common-source line. One end of the first capacitor is coupled to the gate of the first N-type MOSFET and another end of the first capacitor is coupled to the first word line. The second memory cell includes a second N-type metal-oxide-semiconductor field-effect transistor (MOSFET) and a second capacitor. The drain of the second N-type MOSFET is coupled to the second bit line and the source of the second N-type MOSFET is coupled to the first common-source line. One end of the second capacitor is coupled to the gate of the second N-type MOSFET and another end of the second capacitor is coupled to the first word line. The third memory cell includes a third N-type metal-oxide-semiconductor field-effect transistor (MOSFET) and a third capacitor. The drain of the third N-type MOSFET is coupled to the third bit line and the source of the third N-type MOSFET is coupled to the first common-source line. One end of the third capacitor is coupled to the gate of the third N-type MOSFET and another end of the third capacitor is coupled to the first word line. The fourth memory cell includes a fourth N-type metal-oxide-semiconductor field-effect transistor (MOSFET) and a fourth capacitor. The drain of the fourth N-type MOSFET is coupled to the fourth bit line and the source of the fourth N-type MOSFET is coupled to the first common-source line. One end of the fourth capacitor is coupled to the gate of the fourth N-type MOSFET and another end of the fourth capacitor is coupled to the first word line.

In an embodiment of the present invention, when the first memory cell is selected to perform the programming activity, the body of the first N-type MOSFET is coupled to the grounding voltage, the first bit line is coupled to the high voltage, the first common-source line is coupled to the grounding voltage or the low voltage, and the first word line is coupled to the high voltage.

In an embodiment of the present invention, when the first memory cell is not selected to perform the programming activity, the body of the first N-type MOSFET is coupled to the grounding voltage, the first bit line is electrically floating, the first common-source line is coupled to the middle voltage, and the first word line is coupled to the low voltage or the grounding voltage.

In an embodiment of the present invention, when the second memory cell is selected to perform the programming activity, the body of the second N-type MOSFET is coupled to the grounding voltage, the second bit line is coupled to the high voltage, the first common-source line is coupled to the grounding voltage or the low voltage, and the first word line is coupled to the high voltage.

In an embodiment of the present invention, when the second memory cell is not selected to perform the programming activity, the body of the second N-type MOSFET is coupled to the grounding voltage, the second bit line is electrically floating, the first common-source line is coupled to the middle voltage, and the first word line is coupled to the low voltage or the grounding voltage.

In an embodiment of the present invention, when the third memory cell is selected to perform the programming activity, the body of the third N-type MOSFET is coupled to the grounding voltage, the third bit line is coupled to the high voltage, the first common-source line is coupled to the grounding voltage or the low voltage, and the first word line is coupled to the high voltage.

In an embodiment of the present invention, when the third memory cell is not selected to perform the programming activity, the body of the third N-type MOSFET is coupled to the grounding voltage, the third bit line is electrically floating, the first common-source line is coupled to the middle voltage, and the first word line is coupled to the low voltage or the grounding voltage.

In an embodiment of the present invention, when the fourth memory cell is selected to perform the programming activity, the body of the fourth N-type MOSFET is coupled to the grounding voltage, the fourth bit line is coupled to the high voltage, the first common-source line is coupled to the grounding voltage or the low voltage, and the first word line is coupled to the high voltage.

In an embodiment of the present invention, when the fourth memory cell is not selected to perform the programming activity, the body of the fourth N-type MOSFET is coupled to the grounding voltage, the fourth bit line is electrically floating, the first common-source line is coupled to the middle voltage, and the first word line is coupled to the low voltage or the grounding voltage.

In an embodiment of the present invention, when the first memory cell is selected to perform the erasing activity, the body of the first N-type MOSFET is coupled to the grounding voltage, the first bit line is coupled to the high voltage, the first common-source line is coupled to the grounding voltage, and the first word line is coupled to the low voltage or the grounding voltage.

In an embodiment of the present invention, when the first memory cell is not selected to perform the erasing activity, the body of the first N-type MOSFET is coupled to the grounding voltage, the first bit line is electrically floating, the first common-source line is coupled to the middle voltage, and the first word line is coupled to the low voltage or the grounding voltage.

In an embodiment of the present invention, when the second memory cell is selected to perform the erasing activity, the body of the second N-type MOSFET is coupled to the grounding voltage, the second bit line is coupled to the high voltage, the first common-source line is coupled to the grounding voltage, and the first word line is coupled to the low voltage or the grounding voltage.

In an embodiment of the present invention, when the second memory cell is not selected to perform the erasing activity, the body of the second N-type MOSFET is coupled to the grounding voltage, the second bit line is electrically floating, the first common-source line is coupled to the middle voltage, and the first word line is coupled to the low voltage or the grounding voltage.

In an embodiment of the present invention, when the third memory cell is selected to perform the erasing activity, the body of the third N-type MOSFET is coupled to the grounding voltage, the third bit line is coupled to the high voltage, the first common-source line is coupled to the grounding voltage, and the first word line is coupled to the low voltage or the grounding voltage.

In an embodiment of the present invention, when the third memory cell is not selected to perform the erasing activity, the body of the third N-type MOSFET is coupled to the grounding voltage, the third bit line is electrically floating, the first common-source line is coupled to the middle voltage, and the first word line is coupled to the low voltage or the grounding voltage.

In an embodiment of the present invention, when the fourth memory cell is selected to perform the erasing activity, the body of the fourth N-type MOSFET is coupled to the grounding voltage, the fourth bit line is coupled to the high voltage, the first common-source line is coupled to the grounding voltage, and the first word line is coupled to the low voltage or the grounding voltage.

In an embodiment of the present invention, when the fourth memory cell is not selected to perform the erasing activity, the body of the fourth N-type MOSFET is coupled to the grounding voltage, the fourth bit line is electrically floating, the first common-source line is coupled to the middle voltage, and the first word line is coupled to the low voltage or the grounding voltage.

To sum up, the low-power programmable erasable nonvolatile memory stores high-voltage charges in a capacitor with low power and provides a pulse voltage to perform the programming activity and the erasing activity, thereby reducing power consumption and improving the stability of storing data.

Below, the embodiments are described in detail in cooperation with the drawings to make easily understood the technical contents, characteristics and accomplishments of the present invention.

DETAILED DESCRIPTION OF THE INVENTION

Figure 1:
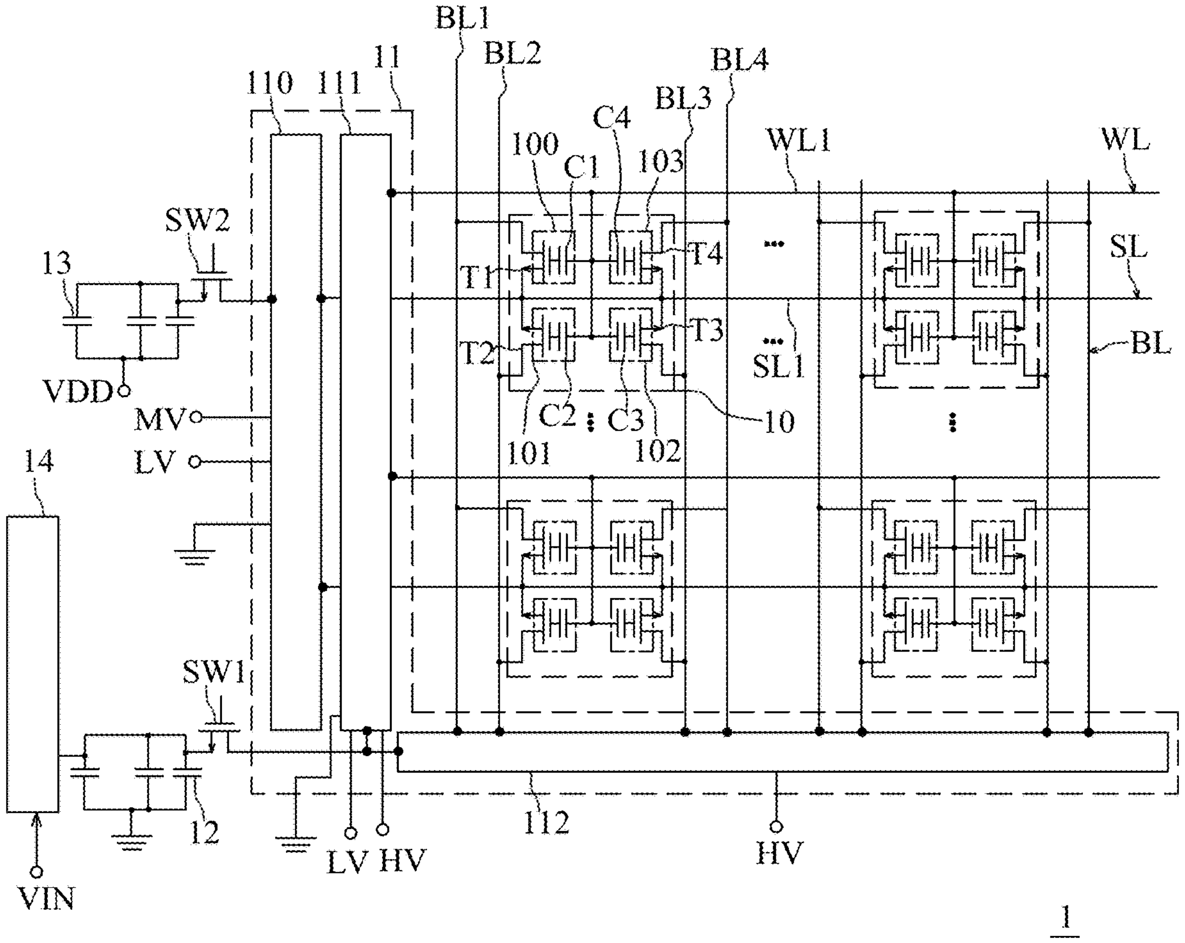
FIG. 1 is a schematic diagram illustrating a low-power programmable erasable nonvolatile memory according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

In the following description, a low-power programmable erasable nonvolatile memory will be provided, which stores high-voltage charges in a capacitor with low power and provides a pulse voltage to perform the programming activity and the erasing activity, thereby reducing power consumption and improving the stability of storing data.

FIG. 1 is a schematic diagram illustrating a low-power programmable erasable nonvolatile memory according to an embodiment of the present invention. Referring to FIG. 1, a low-power programmable erasable nonvolatile memory 1 of the present invention is introduced as follows. The low-power programmable erasable nonvolatile memory 1 includes a plurality of common-source lines SL arranged in parallel, a plurality of word lines WL arranged in parallel, a plurality of bit lines BL arranged in parallel, a plurality of memory arrays 10, a first electronic switch SW1, a second electronic switch SW2, a decoding device 11, at least one first storage capacitor 12, at least one second storage capacitor 13, and a voltage boosting circuit 14. For convenience and clarity, the embodiment is exemplified by the plurality of first storage capacitors 12 and the plurality of second storage capacitors 13. The word lines WL are parallel to the common-source lines SL. The bit lines BL are perpendicular to the common-source lines SL. Each memory array 10 is coupled to one common-source line SL, one word line WL, and four bit lines BL. The decoding device 11 is coupled to the common-source lines SL, the word lines WL, the bit lines BL, a high voltage HV, a middle voltage MV, a low voltage LV, and a grounding voltage. The high voltage HV is greater than the middle voltage MV. The middle voltage MV is greater than the low voltage LV. The low voltage LV is greater than the grounding voltage. One end of the first storage capacitor 12 is coupled to a reference voltage, such as the grounding voltage. Another end of the first storage capacitor 12 is coupled to the decoding device 11 through the first electronic switch SW1. One end of the second storage capacitor 13 is coupled to a supply voltage VDD.

Another end of the second storage capacitor 13 is coupled to the decoding device 11 through the second electronic switch SW2. The voltage boosting circuit 14 is coupled to the first storage capacitor 12.

Figure 2:
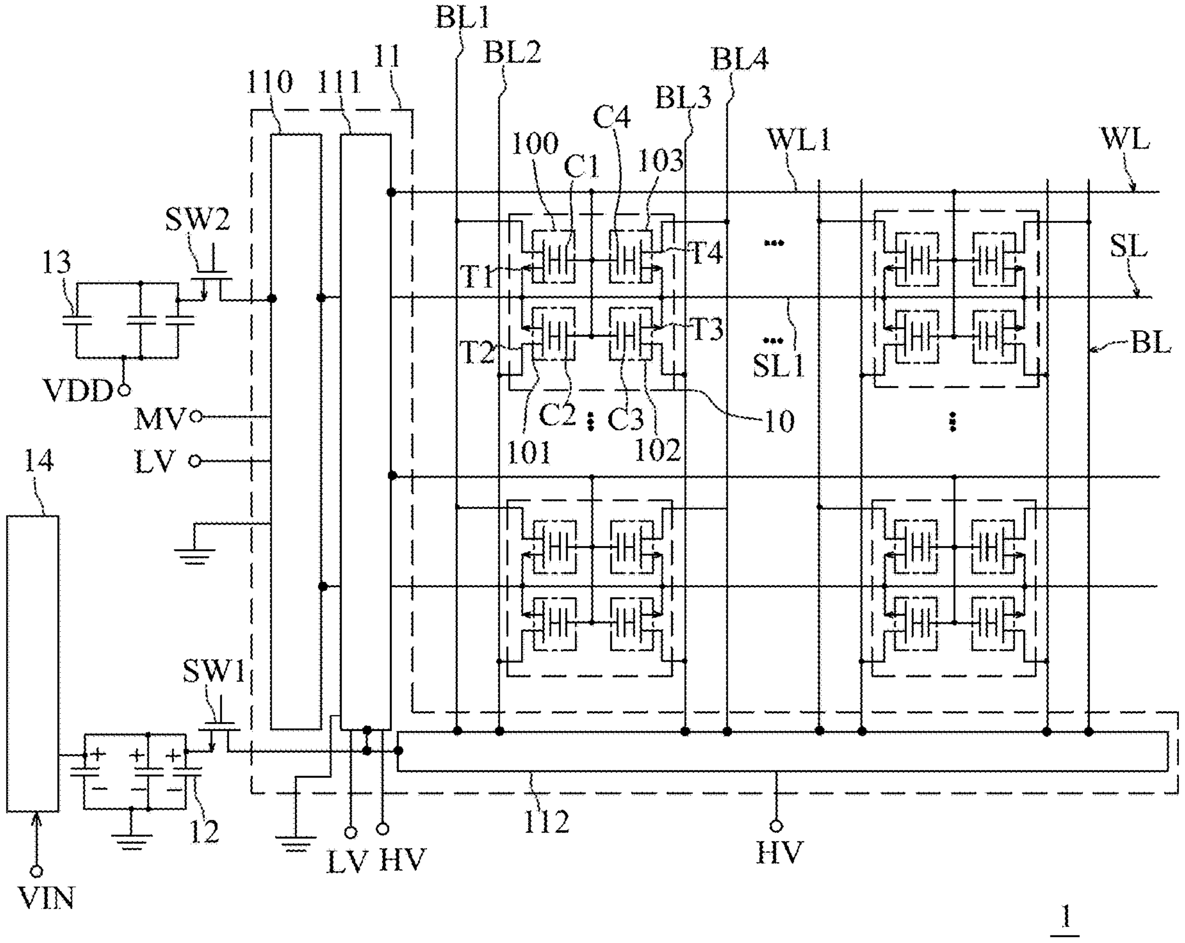
FIG. 2 and FIG. 3 are schematic diagrams illustrating the operation of a low-power programmable erasable nonvolatile memory according to an embodiment of the present invention.
Figure 3:
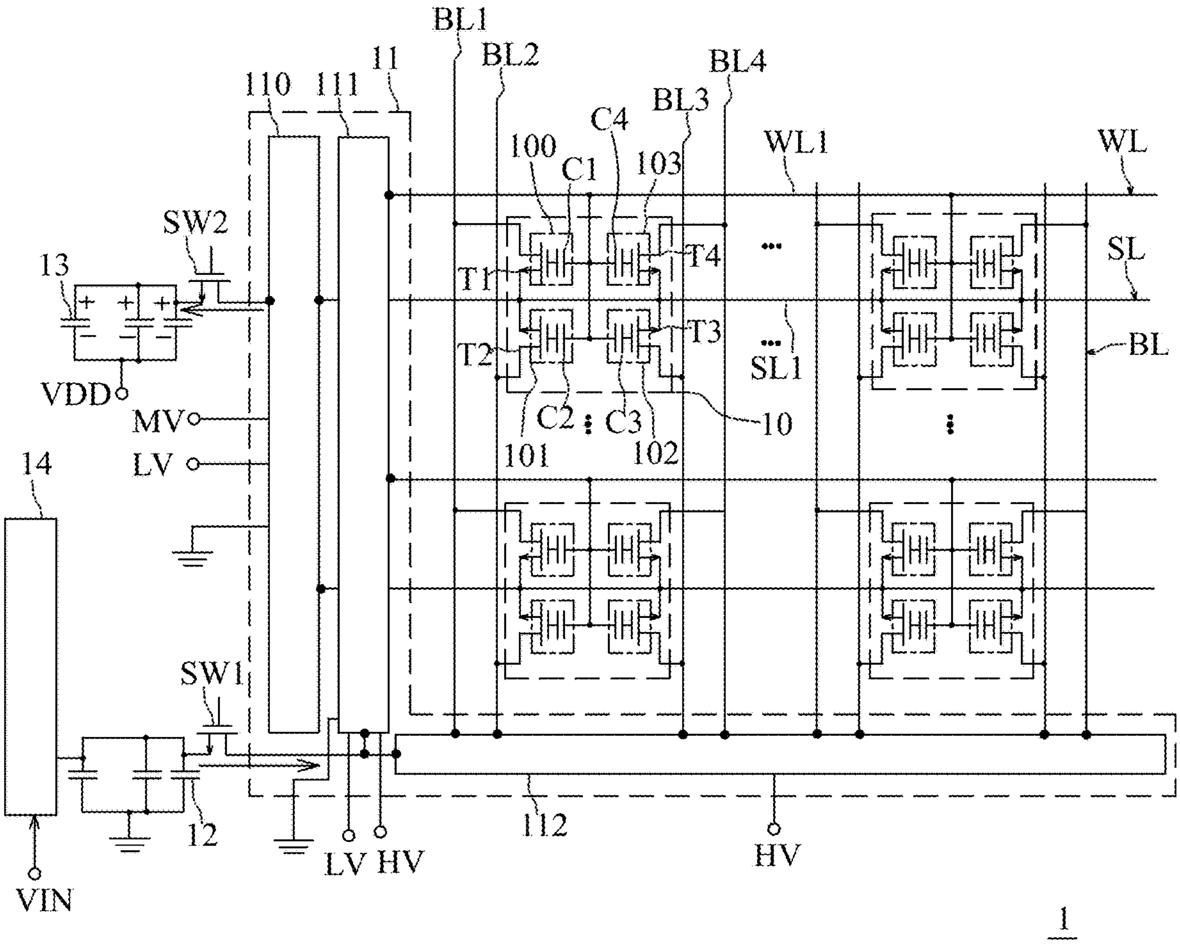

FIG. 2 and FIG. 3 are schematic diagrams illustrating the operation of a low-power programmable erasable nonvolatile memory according to an embodiment of the present invention. As illustrated in FIG. 2, when the first electronic switch SW1 and the second electronic switch SW2 are turned off, the voltage boosting circuit 14 receives an input voltage VIN to charge the first storage capacitor 12 to have a charging voltage greater than the reference voltage. As illustrated in FIG. 3, when the first electronic switch SW1 and the second electronic switch SW2 are turned on, the decoding device 11 biases one of the memory arrays 10 as a target memory array based on voltages coupled to the decoding device 11, and the first storage capacitor 12 charges the second storage capacitor 13 through the target memory array to perform a programming activity or an erasing activity. In other words, the voltage boosting circuit 14 stores high-voltage charges in the first storage capacitor 12 with low power and provides a pulse voltage to perform the programming activity and the erasing activity, thereby reducing power consumption and improving the stability of storing data.

Please refer to FIG. 1. In some embodiments of the present invention, the decoding device 11 may include a first decoder 110, a second decoder 111, and a third decoder 112. The first decoder 110, the second decoder 111, and the third decoder 112 bias the target memory array based on voltages coupled to the first decoder 110, the second decoder 111, and the third decoder 112. The first decoder 110 is coupled to the common-source lines SL, the second electronic switch SW2, the middle voltage MV, the low voltage LV, and the grounding voltage. The first decoder 110 biases the target memory array with the middle voltage MV, the low voltage LV, and the grounding voltage. The second decoder 111 is coupled to the word lines WL, the first electronic switch SW1, the high voltage HV, the low voltage LV, and the grounding voltage. The second decoder 111 biases the target memory array with the high voltage HV, the low voltage LV, and the grounding voltage. The third decoder 112 is coupled to the bit lines BL, the first electronic switch SW1, and the high voltage HV. The third decoder 112 biases the target memory array with the high voltage HV.

The common-source lines SL may include a first common source line SL1. The word lines WL may include a first word line WL1. The bit lines BL may include a first bit line BL1, a second bit line BL2, a third bit line BL3, and a fourth bit line BL4. Each memory array 10 may include a first memory cell 100, a second memory cell 101, a third memory cell 102, and a fourth memory cell 103. The control terminal of the first memory cell 100 is coupled to the first word line WL1. The data terminal of the first memory 100 is coupled to the first common-source line SL1 and the first bit line BL1. The control terminal of the second memory cell 101 is coupled to the first word line WL1. The data terminal of the second memory cell 101 is coupled to the first common-source line SL1 and the second bit line BL2. The control terminal of the third memory cell 102 is coupled to the first word line WL1. The data terminal of the third memory cell 102 is coupled to the first common-source line SL1 and the third bit line BL3. The control terminal of the fourth memory cell 103 is coupled to the first word line WL1. The data terminal of the fourth memory cell 103 is coupled to the first common-source line SL1 and the fourth bit line BL4. The first memory cell 100 and the second memory cell 101 are arranged symmetrically about the first common-source line SL1. The third memory cell 102 and the fourth memory cell 103 are arranged symmetrically about the first common-source line SL1. The first memory cell 100 and the fourth memory cell 103 are located between the first word line WL1 and the first common-source line SL1.

The first memory cell 100 may include a first N-type metal-oxide-semiconductor field-effect transistor (MOSFET) T1 and a first capacitor C1. The drain of the first N-type MOSFET T1 is coupled to the first bit line BL1. The source of the first N-type MOSFET T1 is coupled to the first common-source line SL1. One end of the first capacitor C1 is coupled to the gate of the first N-type MOSFET T1 and another end of the first capacitor C1 is coupled to the first word line WL1. The second memory cell 101 may include a second N-type metal-oxide-semiconductor field-effect transistor (MOSFET) T2 and a second capacitor C2. The drain of the second N-type MOSFET T2 is coupled to the second bit line BL2. The source of the second N-type MOSFET T2 is coupled to the first common-source line SL1. One end of the second capacitor C2 is coupled to the gate of the second N-type MOSFET T2 and another end of the second capacitor C2 is coupled to the first word line WL1. The third memory cell 102 may include a third N-type metal-oxide-semiconductor field-effect transistor (MOSFET) T3 and a third capacitor C3. The drain of the third N-type MOSFET T3 is coupled to the third bit line BL3. The source of the third N-type MOSFET T3 is coupled to the first common-source line SL1. One end of the third capacitor C3 is coupled to the gate of the third N-type MOSFET T3 and another end of the third capacitor C3 is coupled to the first word line WL1. The fourth memory cell 103 may include a fourth N-type metal-oxide-semiconductor field-effect transistor (MOSFET) T4 and a fourth capacitor C4. The drain of the fourth N-type MOSFET T4 is coupled to the fourth bit line BL4. The source of the fourth N-type MOSFET T4 is coupled to the first common-source line SL1. One end of the fourth capacitor C4 is coupled to the gate of the fourth N-type MOSFET T4 and another end of the fourth capacitor C4 is coupled to the first word line WL1.

The operation of the first memory cell 100 is introduced as follows, including those of programming and erasing activities. The common-source line SL or the word bit line WL is coupled to the low voltage LV or the grounding voltage based on the process characteristics. The high voltage HV is equal to the drain-to-source breakdown voltage of the first MOSFET T1 minus the threshold voltage of the first MOSFET T1. The middle voltage MV is equal to the drain-to-source breakdown voltage of the first MOSFET T1×0.5. The low voltage LV is equal to the drain-to-source breakdown voltage of the first MOSFET T1×0.25. The grounding voltage is zero voltage.

When the first memory cell 100 is selected to perform the programming activity, the body of the first N-type MOSFET T1 is coupled to the grounding voltage, the first bit line BL1 is coupled to the high voltage HV, the first common-source line SL1 is coupled to the grounding voltage or the low voltage LV, and the first word line WL1 is coupled to the high voltage HV. When the first memory cell 100 is not selected to perform the programming activity, the body of the first N-type MOSFET T1 is coupled to the grounding voltage, the first bit line BL1 is electrically floating, the first common-source line SL1 is coupled to the middle voltage MV, and the first word line WL1 is coupled to the low voltage LV or the grounding voltage. When the first memory cell 100 is selected to perform the erasing activity, the body of the first N-type MOSFET T1 is coupled to the grounding voltage, the first bit line BL1 is coupled to the high voltage HV, the first common-source line SL1 is coupled to the grounding voltage, and the first word line WL1 is coupled to the low voltage LV or the grounding voltage. When the first memory cell 100 is not selected to perform the erasing activity, the body of the first N-type MOSFET T1 is coupled to the grounding voltage, the first bit line BL1 is electrically floating, the first common-source line SL1 is coupled to the middle voltage MV, and the first word line WL1 is coupled to the low voltage LV or the grounding voltage. The operation of the second memory cell 101 is introduced as follows, including those of programming and erasing activities. The common-source line SL or the word bit line WL is coupled to the low voltage LV or the grounding voltage based on the process characteristics. The high voltage HV is equal to the drain-to-source breakdown voltage of the second MOSFET T2 minus the threshold voltage of the second MOSFET T2. The middle voltage MV is equal to the drain-to-source breakdown voltage of the second MOSFET T2×0.5. The low voltage LV is equal to the drain-to-source breakdown voltage of the second MOSFET T2×0.25. The grounding voltage is zero voltage.

When the second memory cell 101 is selected to perform the programming activity, the body of the second N-type MOSFET T2 is coupled to the grounding voltage, the second bit line BL2 is coupled to the high voltage HV, the first common-source line SL1 is coupled to the grounding voltage or the low voltage LV, and the first word line WL1 is coupled to the high voltage HV. When the second memory cell 101 is not selected to perform the programming activity, the body of the second N-type MOSFET T2 is coupled to the grounding voltage, the second bit line BL2 is electrically floating, the first common-source line SL1 is coupled to the middle voltage MV, and the first word line WL1 is coupled to the low voltage LV or the grounding voltage. When the second memory cell 101 is selected to perform the erasing activity, the body of the second N-type MOSFET T2 is coupled to the grounding voltage, the second bit line BL2 is coupled to the high voltage HV, the first common-source line SL1 is coupled to the grounding voltage, and the first word line WL1 is coupled to the low voltage LV or the grounding voltage. When the second memory cell 101 is not selected to perform the erasing activity, the body of the second N-type MOSFET T2 is coupled to the grounding voltage, the second bit line BL2 is electrically floating, the first common-source line SL1 is coupled to the middle voltage MV, and the first word line WL1 is coupled to the low voltage LV or the grounding voltage.

The operation of the third memory cell 102 is introduced as follows, including those of programming and erasing activities. The common-source line SL or the word bit line WL is coupled to the low voltage LV or the grounding voltage based on the process characteristics. The high voltage HV is equal to the drain-to-source breakdown voltage of the third MOSFET T3 minus the threshold voltage of the third MOSFET T3. The middle voltage MV is equal to the drain-to-source breakdown voltage of the third MOSFET T3×0.5. The low voltage LV is equal to the drain-to-source breakdown voltage of the third MOSFET T3×0.25. The grounding voltage is zero voltage.

When the third memory cell 102 is selected to perform the programming activity, the body of the third N-type MOSFET T3 is coupled to the grounding voltage, the third bit line BL3 is coupled to the high voltage HV, the first common-source line SL1 is coupled to the grounding voltage or the low voltage LV, and the first word line WL1 is coupled to the high voltage HV. When the third memory cell 102 is not selected to perform the programming activity, the body of the third N-type MOSFET T3 is coupled to the grounding voltage, the third bit line BL3 is electrically floating, the first common-source line SL1 is coupled to the middle voltage MV, and the first word line WL1 is coupled to the low voltage LV or the grounding voltage. When the third memory cell 102 is selected to perform the erasing activity, the body of the third N-type MOSFET T3 is coupled to the grounding voltage, the third bit line BL3 is coupled to the high voltage HV, the first common-source line SL1 is coupled to the grounding voltage, and the first word line WL1 is coupled to the low voltage LV or the grounding voltage. When the third memory cell 102 is not selected to perform the erasing activity, the body of the third N-type MOSFET T3 is coupled to the grounding voltage, the third bit line BL3 is electrically floating, the first common-source line SL1 is coupled to the middle voltage MV, and the first word line WL1 is coupled to the low voltage LV or the grounding voltage.

The operation of the fourth memory cell 103 is introduced as follows, including those of programming and erasing activities. The common-source line SL or the word bit line WL is coupled to the low voltage LV or the grounding voltage based on the process characteristics. The high voltage HV is equal to the drain-to-source breakdown voltage of the fourth MOSFET T4 minus the threshold voltage of the fourth MOSFET T4. The middle voltage MV is equal to the drain-to-source breakdown voltage of the fourth MOSFET T4×0.5. The low voltage LV is equal to the drain-to-source breakdown voltage of the fourth MOSFET T4×0.25. The grounding voltage is zero voltage.

When the fourth memory cell 103 is selected to perform the programming activity, the body of the fourth N-type MOSFET T4 is coupled to the grounding voltage, the fourth bit line BL4 is coupled to the high voltage HV, the first common-source line SL1 is coupled to the grounding voltage or the low voltage LV, and the first word line WL1 is coupled to the high voltage HV. When the fourth memory cell 103 is not selected to perform the programming activity, the body of the fourth N-type MOSFET T4 is coupled to the grounding voltage, the fourth bit line BL4 is electrically floating, the first common-source line SL1 is coupled to the middle voltage MV, and the first word line WL1 is coupled to the low voltage LV or the grounding voltage. When the fourth memory cell 103 is selected to perform the erasing activity, the body of the fourth N-type MOSFET T4 is coupled to the grounding voltage, the fourth bit line BL4 is coupled to the high voltage HV, the first common-source line SL1 is coupled to the grounding voltage, and the first word line WL1 is coupled to the low voltage LV or the grounding voltage. When the fourth memory cell 103 is not selected to perform the erasing activity, the body of the fourth N-type MOSFET T4 is coupled to the grounding voltage, the fourth bit line BL4 is electrically floating, the first common-source line SL1 is coupled to the middle voltage MV, and the first word line WL1 is coupled to the low voltage LV or the grounding voltage.

According to the embodiments provided above, the low-power programmable erasable nonvolatile memory stores high-voltage charges in a capacitor with low power and provides a pulse voltage to perform the programming activity and the erasing activity, thereby reducing power consumption and improving the stability of storing data.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A low-power programmable erasable nonvolatile memory comprising:

a plurality of common-source lines arranged in parallel;

a plurality of word lines arranged in parallel, wherein the plurality of word lines are parallel to the plurality of common-source lines;

a plurality of bit lines arranged in parallel, wherein the plurality of bit lines are perpendicular to the plurality of common-source lines;

a plurality of memory arrays each coupled to one of the plurality of common-source lines, one of the plurality of word lines, and four of the plurality of bit lines;

a first electronic switch and a second electronic switch;

a decoding device coupled to the plurality of common-source lines, the plurality of word lines, the plurality of bit lines, a high voltage, a middle voltage, a low voltage, and a grounding voltage, wherein the high voltage is greater than the middle voltage, the middle voltage is greater than the low voltage, and the low voltage is greater than the grounding voltage;

at least one first storage capacitor with one end thereof coupled to a reference voltage, and another end of the at least one first storage capacitor is coupled to the decoding device through the first electronic switch;

at least one second storage capacitor with one end thereof coupled to a supply voltage, and another end of the at least one second storage capacitor is coupled to the decoding device through the second electronic switch; and a voltage boosting circuit coupled to the at least one first storage capacitor, wherein when the first electronic switch and the second electronic switch are turned off, the voltage boosting circuit receives an input voltage to charge the at least one first storage capacitor to have a charging voltage greater than the reference voltage;

wherein when the first electronic switch and the second electronic switch are turned on, the decoding device biases one of the plurality of memory arrays as a target memory array based on voltages coupled to the decoding device, and the at least one first storage capacitor charges the at least one second storage capacitor through the target memory array to perform a programming activity or an erasing activity.

2. The low-power programmable erasable nonvolatile memory according to claim 1, wherein the decoding device includes:

a first decoder coupled to the plurality of common-source lines, the second electronic switch, the middle voltage, the low voltage, and the grounding voltage;

a second decoder coupled to the plurality of word lines, the first electronic switch, the high voltage, the low voltage, and the grounding voltage; and a third decoder coupled to the plurality of bit lines, the first electronic switch, and the high voltage;

wherein the first decoder, the second decoder, and the third decoder are configured to bias the target memory array based on the voltages coupled to the first decoder, the second decoder and the third decoder.

3. The low-power programmable erasable nonvolatile memory according to claim 1, wherein the plurality of common-source lines include a first common source line, the plurality of word lines include a first word line, the plurality of bit lines include a first bit line, a second bit line, a third bit line, and a fourth bit line, and each of the memory arrays includes:

a first memory cell with a control terminal thereof coupled to the first word line, and a data terminal of the first memory cell is coupled to the first common-source line and the first bit line;

a second memory cell with a control terminal thereof coupled to the first word line, and a data terminal of the second memory cell is coupled to the first common-source line and the second bit line;

a third memory cell with a control terminal thereof coupled to the first word line, and a data terminal of the third memory cell is coupled to the first common-source line and the third bit line; and a fourth memory cell with a control terminal thereof coupled to the first word line, and a data terminal of the fourth memory cell is coupled to the first common-source line and the fourth bit line;

wherein the first memory cell and the second memory cell are arranged symmetrically about the first common-source line, the third memory cell and the fourth memory cell are arranged symmetrically about the first common-source line, and the first memory cell and the fourth memory cell are located between the first word line and the first common-source line.

4. The low-power programmable erasable nonvolatile memory according to claim 3, wherein the first memory cell includes:

a first N-type metal-oxide-semiconductor field-effect transistor (MOSFET) with a drain thereof coupled to the first bit line, and a source of the first N-type MOSFET is coupled to the first common-source line; and a first capacitor with one end thereof coupled to a gate of the first N-type MOSFET, and another end of the first capacitor is coupled to the first word line;

the second memory cell includes:

a second N-type metal-oxide-semiconductor field-effect transistor (MOSFET) with a drain thereof coupled to the second bit line, and a source of the second N-type MOSFET is coupled to the first common-source line; and a second capacitor with one end thereof coupled to a gate of the second N-type MOSFET, and another end of the second capacitor is coupled to the first word line;

the third memory cell includes:

a third N-type metal-oxide-semiconductor field-effect transistor (MOSFET) with a drain thereof coupled to the third bit line, and a source of the third N-type MOSFET is coupled to the first common-source line; and a third capacitor with one end thereof coupled to a gate of the third N-type MOSFET, and another end of the third capacitor is coupled to the first word line; and the fourth memory cell includes:

a fourth N-type metal-oxide-semiconductor field-effect transistor (MOSFET) with a drain thereof coupled to the fourth bit line, and a source of the fourth N-type MOSFET is coupled to the first common-source line; and a fourth capacitor with one end thereof coupled to a gate of the fourth N-type MOSFET, and another end of the fourth capacitor is coupled to the first word line.

5. The low-power programmable erasable nonvolatile memory according to claim 4, wherein when the first memory cell is selected to perform the programming activity, a body of the first N-type MOSFET is coupled to the grounding voltage, the first bit line is coupled to the high voltage, the first common-source line is coupled to the grounding voltage or the low voltage, and the first word line is coupled to the high voltage.

6. The low-power programmable erasable nonvolatile memory according to claim 4, wherein when the first memory cell is not selected to perform the programming activity, a body of the first N-type MOSFET is coupled to the grounding voltage, the first bit line is electrically floating, the first common-source line is coupled to the middle voltage, and the first word line is coupled to the low voltage or the grounding voltage.

7. The low-power programmable erasable nonvolatile memory according to claim 4, wherein when the second memory cell is selected to perform the programming activity, a body of the second N-type MOSFET is coupled to the grounding voltage, the second bit line is coupled to the high voltage, the first common-source line is coupled to the grounding voltage or the low voltage, and the first word line is coupled to the high voltage.

8. The low-power programmable erasable nonvolatile memory according to claim 4, wherein when the second memory cell is not selected to perform the programming activity, a body of the second N-type MOSFET is coupled to the grounding voltage, the second bit line is electrically floating, the first common-source line is coupled to the middle voltage, and the first word line is coupled to the low voltage or the grounding voltage.

9. The low-power programmable erasable nonvolatile memory according to claim 4, wherein when the third memory cell is selected to perform the programming activity, a body of the third N-type MOSFET is coupled to the grounding voltage, the third bit line is coupled to the high voltage, the first common-source line is coupled to the grounding voltage or the low voltage, and the first word line is coupled to the high voltage.

10. The low-power programmable erasable nonvolatile memory according to claim 4, wherein when the third memory cell is not selected to perform the programming activity, a body of the third N-type MOSFET is coupled to the grounding voltage, the third bit line is electrically floating, the first common-source line is coupled to the middle voltage, and the first word line is coupled to the low voltage or the grounding voltage.

11. The low-power programmable erasable nonvolatile memory according to claim 4, wherein when the fourth memory cell is selected to perform the programming activity, a body of the fourth N-type MOSFET is coupled to the grounding voltage, the fourth bit line is coupled to the high voltage, the first common-source line is coupled to the grounding voltage or the low voltage, and the first word line is coupled to the high voltage.

12. The low-power programmable erasable nonvolatile memory according to claim 4, wherein when the fourth memory cell is not selected to perform the programming activity, a body of the fourth N-type MOSFET is coupled to the grounding voltage, the fourth bit line is electrically floating, the first common-source line is coupled to the middle voltage, and the first word line is coupled to the low voltage or the grounding voltage.

13. The low-power programmable erasable nonvolatile memory according to claim 4, wherein when the first memory cell is selected to perform the erasing activity, a body of the first N-type MOSFET is coupled to the grounding voltage, the first bit line is coupled to the high voltage, the first common-source line is coupled to the grounding voltage, and the first word line is coupled to the low voltage or the grounding voltage.

14. The low-power programmable erasable nonvolatile memory according to claim 4, wherein when the first memory cell is not selected to perform the erasing activity, a body of the first N-type MOSFET is coupled to the grounding voltage, the first bit line is electrically floating, the first common-source line is coupled to the middle voltage, and the first word line is coupled to the low voltage or the grounding voltage.

15. The low-power programmable erasable nonvolatile memory according to claim 4, wherein when the second memory cell is selected to perform the erasing activity, a body of the second N-type MOSFET is coupled to the grounding voltage, the second bit line is coupled to the high voltage, the first common-source line is coupled to the grounding voltage, and the first word line is coupled to the low voltage or the grounding voltage.

16. The low-power programmable erasable nonvolatile memory according to claim 4, wherein when the second memory cell is not selected to perform the erasing activity, a body of the second N-type MOSFET is coupled to the grounding voltage, the second bit line is electrically floating, the first common-source line is coupled to the middle voltage, and the first word line is coupled to the low voltage or the grounding voltage.

17. The low-power programmable erasable nonvolatile memory according to claim 4, wherein when the third memory cell is selected to perform the erasing activity, a body of the third N-type MOSFET is coupled to the grounding voltage, the third bit line is coupled to the high voltage, the first common-source line is coupled to the grounding voltage, and the first word line is coupled to the low voltage or the grounding voltage.

18. The low-power programmable erasable nonvolatile memory according to claim 4, wherein when the third memory cell is not selected to perform the erasing activity, a body of the third N-type MOSFET is coupled to the grounding voltage, the third bit line is electrically floating, the first common-source line is coupled to the middle voltage, and the first word line is coupled to the low voltage or the grounding voltage.

19. The low-power programmable erasable nonvolatile memory according to claim 4, wherein when the fourth memory cell is selected to perform the erasing activity, a body of the fourth N-type MOSFET is coupled to the grounding voltage, the fourth bit line is coupled to the high voltage, the first common-source line is coupled to the grounding voltage, and the first word line is coupled to the low voltage or the grounding voltage.

20. The low-power programmable erasable nonvolatile memory according to claim 4, wherein when the fourth memory cell is not selected to perform the erasing activity, a body of the fourth N-type MOSFET is coupled to the grounding voltage, the fourth bit line is electrically floating, the first common-source line is coupled to the middle voltage, and the first word line is coupled to the low voltage or the grounding voltage.

* * * * *